US007071557B2

(12) United States Patent
Akram

(10) Patent No.: US 7,071,557 B2
(45) **Date of Patent: *Jul. 4, 2006**

(54) METALLIZATION STRUCTURES FOR SEMICONDUCTOR DEVICE INTERCONNECTS, METHODS FOR MAKING SAME, AND SEMICONDUCTOR DEVICES INCLUDING SAME

(75) Inventor: Salman Akram, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154 (a)(2).

Subject to any disclaimer, the term of this patent is extended or adjusted under 35 U.S.C. 154(b) by 0 days.

(21) Appl. No.: 09/388,031

(22) Filed: Sep. 1, 1999

(65) Prior Publication Data

US 2002/0056914 A1 May 16, 2002

(51) Int. Cl.
*H01L 23/52* (2006.01)

(52) U.S. Cl. ...................... 257/751; 257/748; 257/773; 257/774; 257/762; 257/758

(58) Field of Classification Search ................ 257/301, 257/296, 669, 750, 752, 486, 751, 748, 741, 257/773, 774, 762, 758; 438/625, 627, 643, 438/653

See application file for complete search history.

(56) References Cited

U.S. PATENT DOCUMENTS 4,619,037 A * 10/1986 Taguchi et al. ............... 29/578
4,988,423 A 1/1991 Yamamoto et al.
5,275,973 A * 1/1994 Gelatos ....................... 216/18
5,300,813 A 4/1994 Joshi et al.
5,317,185 A 5/1994 Fernandes et al.
5,321,211 A * 6/1994 Haslam et al. .............. 174/262
5,335,138 A * 8/1994 Sandhu et al. .............. 257/306
5,356,659 A 10/1994 Seshubabu et al.
5,475,267 A 12/1995 Ishii et al.
5,489,548 A * 2/1996 Nishioka et al. ............ 438/396
5,498,889 A * 3/1996 Hayden ...................... 257/301

(Continued)

FOREIGN PATENT DOCUMENTS

EP 502647 A2 * 9/1992

(Continued)

OTHER PUBLICATIONS

Definition of "extent", Merriam-Webster online Dictionary, 10th edition, www.m-w.com.

*Primary Examiner*—Eugene Lee
(74) *Attorney, Agent, or Firm*—TraskBritt

(57) ABSTRACT

The present invention provides a metallization structure for semiconductor device interconnects such as a conductive line, and methods for making the same, wherein the metallization structure includes a substrate with a substantially planar upper surface, a foundation metal layer disposed on a portion of the substrate upper surface, a primary conducting metal layer overlying the foundation metal layer, and a metal spacer on the sidewalls of the primary conducting metal layer and the foundation metal layer. The present invention also provides a metallization structure and a method for making the same, wherein the metallization structure includes a substrate with a foundation metal layer disposed thereon, a dielectric layer with an aperture therethrough being disposed on the substrate, where the bottom of the aperture exposes the foundation metal layer of the substrate and a metal spacer on the sidewall of the aperture and a line or plug of a primary conducting metal filling the remaining portion of the aperture. These metallization structures are useful for reducing the incidence and severity of thermally induced stress voids.

52 Claims, 9 Drawing Sheets

13
100
16
10
16
8
6
4

60
66
60
64
54
52
50

U.S. PATENT DOCUMENTS 5,529,954 A 6/1996 Iijima et al.
5,534,463 A * 7/1996 Lee et al. .................. 437/195
5,545,590 A * 8/1996 Licata ........................ 438/629
5,578,523 A * 11/1996 Fiordalice et al. .......... 437/190
5,637,527 A * 6/1997 Baek .......................... 438/396
5,701,647 A * 12/1997 Saenger et al. .............. 29/25.4
5,712,195 A * 1/1998 Chang ........................ 437/195
5,770,519 A 6/1998 Klein et al.
5,793,057 A * 8/1998 Summerfelt ................. 257/55
5,808,365 A * 9/1998 Mori .......................... 257/775
5,825,609 A * 10/1998 Andricacos et al. ........ 361/321
5,879,957 A * 3/1999 Joo .............................. 438/3
5,903,053 A * 5/1999 Iijima et al. ................ 257/751
5,913,143 A * 6/1999 Harakawa ................... 438/627
5,917,244 A * 6/1999 Lee et al. .................. 257/762
5,937,319 A * 8/1999 Xiang et al. ................ 438/585
5,960,282 A * 9/1999 Chuang ...................... 438/255
5,985,762 A * 11/1999 Geffken et al. ............. 438/627
6,020,233 A 2/2000 Kim
6,030,896 A * 2/2000 Brown ....................... 257/762
6,046,502 A * 4/2000 Matsuno ..................... 257/751
6,054,380 A * 4/2000 Naik .......................... 438/624
6,060,377 A * 5/2000 Xiang et al. ................ 438/197
6,066,560 A 5/2000 Yakura
6,071,787 A * 6/2000 Joo ........................... 438/369
6,074,943 A * 6/2000 Brennan et al. ............ 438/636
6,133,635 A * 10/2000 Bothra et al. ............... 257/758
6,140,235 A 10/2000 Yao et al.
6,153,900 A * 11/2000 Chang et al. ............... 257/301
6,166,439 A * 12/2000 Cox ........................... 257/758
6,180,517 B1 * 1/2001 Liou et al. .................. 438/639
6,197,682 B1 * 3/2001 Drynan et al. .............. 438/639
6,235,626 B1 * 5/2001 Makino et al. ............. 438/637
6,242,340 B1 * 6/2001 Lee ............................ 438/624
6,255,734 B1 * 7/2001 Liu et al. .................... 257/662
6,277,745 B1 * 8/2001 Liu et al. .................... 438/687
6,281,115 B1 * 8/2001 Chang et al. ............... 438/637
6,285,082 B1 * 9/2001 Joshi et al. ................. 257/750
6,307,266 B1 * 10/2001 Yung .......................... 257/751
6,384,438 B1 5/2002 Cho et al.
6,420,725 B1 7/2002 Harshfield
6,436,816 B1 * 8/2002 Lee et al. ................... 438/643
6,646,340 B1 * 11/2003 Deeter et al. ............... 257/712
6,677,647 B1 * 1/2004 Dawson ...................... 257/368
2001/0044202 A1 11/2001 Huang et al.

FOREIGN PATENT DOCUMENTS

JP 01101671 A 4/1989

* cited by examiner

METALLIZATION STRUCTURES FOR SEMICONDUCTOR DEVICE INTERCONNECTS, METHODS FOR MAKING SAME, AND SEMICONDUCTOR DEVICES INCLUDING SAME

BACKGROUND OF THE INVENTION

1. Field of the Invention

This invention relates generally to the field of semiconductor device design and fabrication. Specifically, the invention relates to methods for manufacturing metallization structures in integrated circuit devices and the resulting structures.

2. State of the Art

Integrated circuits (ICs) contain numerous individual devices, such as transistors and capacitors, that are interconnected by an intricate network of horizontal and vertical conductive lines commonly termed "interconnects." Exemplary interconnect structures are disclosed in U.S. Pat. Nos. 5,545,590, 5,529,954, 5,300,813, 4,988,423, and 5,356,659, each of which patents is hereby incorporated herein by reference.

Aluminum interconnect structures are decreasing in size and pitch (spacing), as the industry trend continues toward, and includes submicron features and pitches. The resultant reduction in structure sizes leads to numerous reliability concerns, including electromigration and stress voiding of the interconnect structures.

Stress notches (also known as stress voids) on the surface of conductive interconnect structures are of concern because the voids or notches degrade reliability and device performance. Stress notches, when formed in a conductive line, may render the line substantially discontinuous and unable to effectively transmit a signal. Stress notches at a grain boundary are extremely detrimental, as they may propagate along the boundary and sever the conductive line completely.

Stress notches are also undesirable because they can alter the resistivity of a conductive line and change the speed at which signals are transmitted. Resistivity changes from stress notching are especially important as line dimensions shrink, because notching in a submicron conductive line alters resistivity more than notching in a larger line with its consequently greater cross-sectional area. Thus, the ever more stringent pitch sizing and higher aspect ratios (height to width of the structure or feature) sought by practitioners in the art have imitated considerable stress voiding concerns.

It is believed that stress notching results from both structural and thermal stresses between conductive lines and adjacent insulating and passivation layers. Kordic et al., *Size and Volume Distributions of Thermally Induced Stress Voids in AlCu Metallization*, Appl. Phys. Lett., Vol. 68, No. 8, Feb. 19, 1996, pp. 1060–1062, incorporated herein by reference, describes how stress voids begin at the edge of a conductive line where the density of the grain boundaries is largest. As illustrated in FIG. 12 herein, stress notches form at the exterior surfaces and surface intersections of the conductive lines in order to relieve areas of high stress concentration. The notches may then propagate into, and across, the interior of the conductive line until the line becomes disrupted, cracked, and/or discontinuous.

Aluminum (Al) and Al alloy (such as Al/Cu) lines are especially susceptible to stress notching because of both the thermal expansion mismatch between Al and adjacent layers and the relatively low melting point of Al. As the temperature changes, stresses are induced in Al or Al alloy lines because aluminum's coefficient of thermal expansion (CTE) differs from the CTE of the materials comprising the adjacent layers. To relieve these stresses, Al atoms migrate and form stress notches. Further, because Al has a low melting point, Al atoms migrate easily at low temperatures and aggravate a tendency toward stress notch formation.

Several methods have been proposed to reduce stress notching. One proposed method uses a material less susceptible to stress notching, such as copper (Cu) or tungsten (W), in the conductive line. Using Cu in conductive lines, however, has in the past resulted in several problems. First, copper is difficult to etch. Second, adhesion between copper and adjacent insulating layers is poor and thus poses reliability concerns. Third, adding Cu to Al lines may reduce stress notching, but beyond a certain Cu concentration, device performance may begin to degrade. Fourth, as conductive line geometries shrink, adding Cu to Al lines seems less effective in reducing stress notching. Finally, even using Cu interconnects in the manner employed in the prior art can still lead to notching effects, especially at 0.1 μm geometries and below since, at such dimensions, line widths have become so small that any imperfection can cause openings. Using W in Al conducting lines is also undesirable—W has a high resistivity and therefore reduces signal speed.

Another proposed method to reduce stress notching modifies how the layers adjacent conductive lines (e.g., insulating and passivation layers) are formed. This method has focused, without notable success, on the rate, temperature, and/or pressure at which the adjacent layers are deposited, as well as the chemical composition of such layers.

Yet another proposed method to reduce stress notching comprises forming a cap on the conductive lines. Such caps can be formed from TiN, W, or Ti—W compounds. These materials have higher melting points than Al and, therefore, have a higher resistance to stress notching. A disadvantage in using such caps, however, is that additional process steps, such as masking steps, are required.

U.S. Pat. No. 5,317,185, incorporated herein by reference, describes still another proposed method for reducing stress notching. This patent discloses an IC device having a plurality of conductive lines, where the outermost conductive line is a stress-reducing line. This stress reducing line is a non active structure that reduces stress concentrations in the inner conductive lines.

SUMMARY OF THE INVENTION

The present invention relates to a metallization structure for semiconductor device interconnects comprising a substrate having a substantially planar upper surface, a metal layer disposed on a portion of the substrate upper surface, a conducting layer overlying the metal layer, and metal spacers flanking the sidewalls of the conducting layer and the underlying metal layer. The metal layer and metal spacers do not encapsulate the conducting layer. The substrate upper surface is preferably a dielectric layer. The conducting layer preferably comprises aluminum or an aluminum-copper alloy, but may also comprise copper. When the conducting layer comprises Al, the metal layer and metal spacer preferably comprise titanium, such as Ti or TiN. An optional dielectric layer, preferably silicon oxide, may be disposed on the conducting layer. When the optional dielectric layer is present, the metal spacer extends along the sidewall of the dielectric layer.

The present invention also relates to a metallization structure comprising a substrate having a metal layer disposed thereon, a dielectric layer having an aperture therethrough disposed on the substrate so the bottom of the aperture exposes the upper surface of the metal layer, at least one metal spacer on the sidewall of the aperture, and a conducting layer filling the remaining portion of the aperture. The metal layer and metal spacer preferably comprise titanium, such as Ti or TiN. At least one upper metal layer may be disposed on the conducting layer.

The present invention further relates to a method for making a metallization structure by forming a substantially planar first dielectric layer on a substrate, forming a metal layer over the first dielectric layer, forming a conducting layer over the metal layer, forming a second dielectric layer over the conducting layer, removing a portion of the second dielectric layer, conducting layer, and metal layer to form a multi-layer structure, and forming metal spacers on the sidewalls of the multi-layer structure. The process optionally removes both the second dielectric layer portion of the multi-layer structure and the laterally adjacent portions of the metal spacers.

The present invention additionally relates to a method for making a metallization structure by forming a substrate comprising a metal layer disposed thereon, forming a dielectric layer comprising an aperture on the substrate so the bottom of the aperture exposes the upper surface of the metal layer, forming a metal spacer on the sidewall (in the case of a via) or sidewalls (in the case of a trench) of the aperture, and forming a conducting layer in the remaining portion of the aperture. At least one upper metal layer may optionally be formed on the conducting layer.

The present invention also relates to a method for making a metallization structure by forming a substrate comprising a metal layer on the surface thereof, forming on the substrate a dielectric layer comprising an aperture so the bottom of the aperture exposes the surface of the metal layer, forming a conducting layer in the aperture, forming an upper metal layer overlying the dielectric layer and the aperture, removing the portions of the upper metal layer overlying the dielectric layer, removing the dielectric layer, removing the portions of the metal layer not underlying the aperture to form a multi-layer metal structure, and forming a metal spacer on the sidewall or sidewalls of the multi-layer metal structure.

The present invention provides several advantages when compared to the prior art. One advantage is that thermally induced stress voids are reduced because the metal layer and metal spacer comprise materials exhibiting good thermal-voiding avoidance characteristics. Another advantage is that the size of conductive lines can be shrunk further in comparison to dimensions achievable by conventional processes, since only one additional deposition and etch step, without an additional masking step, is needed to form the metallization structure. Shrinking of conductive lines is necessary as device geometries decrease to less than 0.1 μm. At these small geometries, even small notches can significantly decrease conductivity.

The invention also specifically includes semiconductor devices including the inventive metallization structures.

BRIEF DESCRIPTION OF THE SEVERAL VIEWS OF THE DRAWINGS

The present invention, in part, is illustrated by the accompanying drawings in which.

DESCRIPTION OF THE INVENTION

Generally, the present invention relates to a metallization structure for interconnects and semiconductor devices including same. Specifically, the present invention reduces stress voiding, especially thermally induced stress voiding, in conducting lines. The metallization structures described below exemplify the present invention without reference to a specific device because the inventive process and structure can be modified by one of ordinary skill in the art for any desired device.

The following description provides specific details, such as material thicknesses and types, in order to provide a thorough description of the present invention. The skilled artisan, however, would understand that the present invention may be practiced without employing these specific details. Indeed, the present invention can be practiced in conjunction with conventional fabrication techniques employed in the industry.

The process steps described below do not form a complete process flow for manufacturing IC devices. Further, the metallization structures described below do not form a complete IC device. Only the process steps and structures necessary to understand the present invention are described below.

Figure 1:
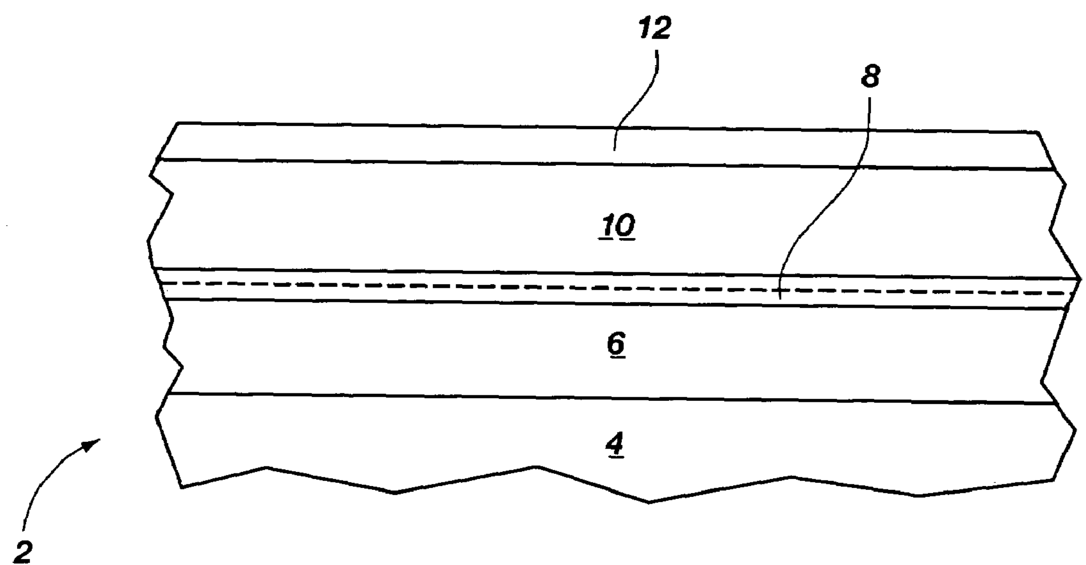
FIGS. 1, 2, 3*a*, and 3*b* illustrate cross-sectional views of one process of forming a metallization structure, and the structure formed thereby, according to the invention.

One embodiment of a process and resulting metallization structure of the present invention is illustrated in FIGS. 1, 2, 3*a*, and 3*b*. This embodiment may be characterized as a predominantly "subtractive" process, in comparison to the second embodiment discussed hereinafter, in that portions of superimposed material layers are removed to define the interconnect structure features, such as lines. As shown in FIG. 1, a portion of semiconductor device 2 includes substrate 4 with overlying first dielectric layer 6. Substrate 4 may be any surface suitable for integrated circuit device formation, such as a silicon or other semiconductor wafer or other substrate, and may be doped and/or include an epitaxial layer. Substrate 4 may also be an intermediate layer in a semiconductor device, such as a metal contact layer or an interlevel dielectric layer. Preferably, substrate 4 is a silicon wafer or bulk silicon region, such as a silicon-on-insulator (SOI) or silicon-on-sapphire (SOS) structure.

First dielectric layer 6 may comprise any dielectric material used in IC device fabrication. Examples of such dielectric materials include silicon oxide, silicon nitride, silicon oxynitride, silicon oxide containing dopants such as boron (B) or phosphorus (P), organic dielectrics, or a layered dielectric film of these materials. Preferably, first dielectric layer 6 is silicon oxide or borophosphosilicate glass (BPSG). First dielectric layer 6 may be formed by any process yielding the desired physical and chemical characteristics, such as thermal oxidation, thermal nitridation, or vapor deposition.

Overlying first dielectric layer 6 is metal layer 8. One or more individual metal layers may be used as metal layer 8. For example, if two superimposed metal layers are employed (represented by the dashed line in metal layer 8), an adhesion-promoting metal layer can be a first, lower portion of metal layer 8 on first dielectric layer 6 and a stress-reducing layer can be a second, upper portion of metal layer 8. Other metal layers might be included for other functions, such as a layer for reducing electromigration. Preferably, a single metal layer is used as metal layer 8, especially when the single layer can reduce electromigration, function as an adhesion-promoting layer, and function as a stress-reducing layer. If two metal layers are employed, the first, upper metal layer may, for example, comprise tantalum, titanium, tungsten, TaN, or TiN and the second, lower metal layer overlying first dielectric layer 6 may, for example, comprise TiN, TiW, WN, or TaN.

Metal layer 8 includes not only metals, but their alloys and compounds (e.g., nitrides and silicides). For example, a metal layer containing titanium might also contain nitrogen or silicon, such as titanium nitride or titanium silicide. Any metal, metal alloy, or metal compound can be employed in metal layer 8, provided it exhibits the characteristics described above, either alone or when combined with other metal layers. Examples of metals that can be employed in metal layer 8 include cobalt (Co), Ti, W, Ta, molybdenum (Mo), and alloys and compounds thereof, such as TiW or TiN. Preferably, metal layer 8 comprises titanium. Titanium is a good adhesion layer and serves as a stress reducing layer since Ti exhibits good thermal voiding resistance characteristics.

Metal layer 8 is deposited or otherwise formed by any process used in IC device fabrication. For example, metal layer 8 may be deposited by chemical vapor deposition (CVD) or physical vapor deposition (PVD) techniques, depending on the characteristics required of the layer. As used herein, the term "CVD techniques" encompasses, without limitation, plasma-enhanced CVD, or PECVD. Preferably, when metal layer 8 is Ti, this layer is formed by sputtering (a form of PVD) a film of Ti. If metal layer 8 is a metal nitride, it may be formed, for example, by depositing the metal in a nitrogen-containing atmosphere or by depositing the metal and annealing in a nitrogen-containing atmosphere. If metal layer 8 is a metal silicide, it may be formed, for example, by first depositing either the metal layer or a silicon layer, then depositing the other, and heating to react the two layers and form the silicide. If metal layer 8 is a metal alloy, it may be formed by any process suitable for depositing the metal alloy. For example, either sputtering or CVD techniques can be employed.

Conducting layer 10 is then formed over metal layer 8. Conducting layer 10 may comprise any conducting material used in IC device fabrication. Preferably, conducting layer 10 comprises a conducting metal, such as Al, optionally containing other elements such as Si, W, Ti, and/or Cu. More preferably, conducting layer 10 is an aluminum-copper alloy. Conducting layer 10 may also be formed of Cu. Conducting layer 10 may be formed by any method used in IC device fabrication such as CVD or PVD techniques. Preferably, conducting layer 10 is deposited by a PVD method such as sputtering, as known in the art. Second dielectric layer 12 is next deposited or otherwise formed on top of conducting layer 10. Second dielectric layer 12 comprises any dielectric material used in IC device fabrication, including those listed above. Preferably, second dielectric layer 12 comprises a material that serves as an etch stop, as explained below. More preferably, second dielectric layer 12 comprises fluorine-doped silicon oxide or other low dielectric constant material. Second dielectric layer 12 may be formed by any suitable process giving the desired physical and chemical characteristics, such as CVD, PECVD (plasma enhanced chemical vapor deposition), spin-on methods, or otherwise, depending upon the dielectric material selected. For use of the preferred fluorine-doped silicon oxide, the preferred deposition method is PECVD.

Figure 2:
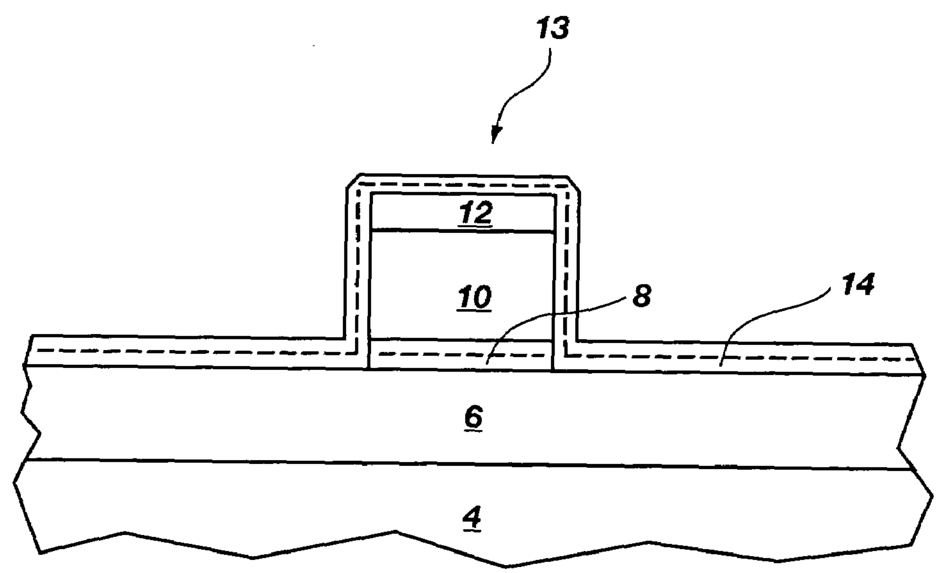

As shown in FIG. 2, portions of second dielectric layer 12, conducting layer 10, and metal layer 8 have been removed, forming multi-layer structure 13. The portions of layers 8, 10 and 12 are removed by any IC device fabrication process, such as a photolithographic patterning and dry etching process. The resulting multi-layer structure forms the basis for an interconnect structure according to the present invention. Of course, the patterning and etch process would normally be performed to define a large number of interconnect structures, such as conductive lines 100 (see FIGS. 3*a* and 3*b*) extending across substrate 4.

As also shown in FIG. 2, second metal layer 14 (also termed a metal spacer layer) is then deposited on first dielectric layer 6 and over multi-layer structure 13. In similar fashion to the structure of metal layer 8, one or more individual metal layers, illustrated by the dashed line within second metal layer 14, may be used as second metal layer 14. Preferably, a single metal layer is used as second metal layer 14 for the same reasons as those set forth for metal layer 8.

Like metal layer 8, second metal layer 14 includes not only metals but their alloys and compounds (e.g., nitrides and silicides). Preferably, when conducting layer 10 comprises aluminum, second metal layer 14 comprises Ti. If conducting layer 10 comprises Cu, second metal layer 14 preferably comprises TiW. More preferably, second metal layer 14 comprises the same metal as metal layer 8. Second metal layer 14 may be deposited or otherwise formed by a process similar to the process used to form metal layer 8. Preferably, second metal layer 14 is formed by a conformal deposition process, such as CVD.

Figure 3A:
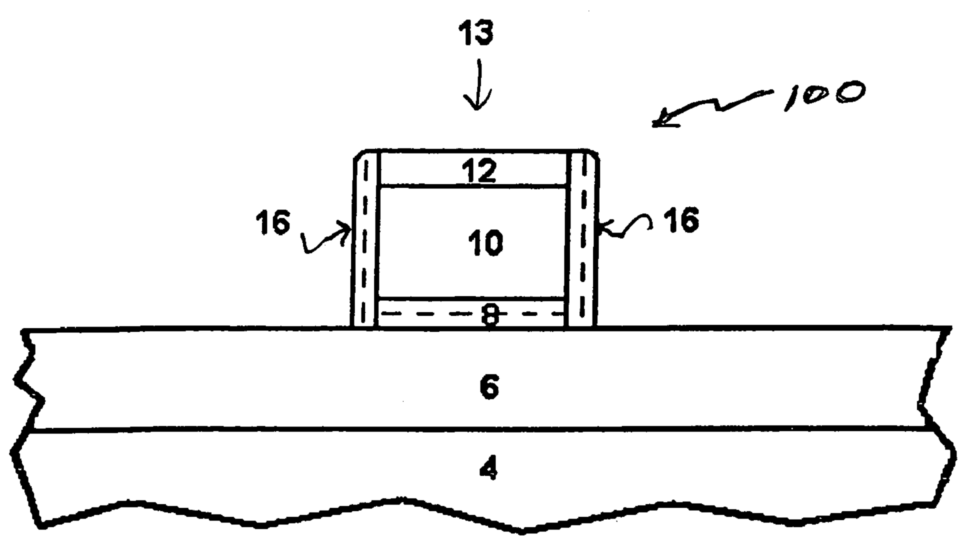

Next, as illustrated in FIG. 3*a*, second metal layer 14 is spacer etched to remove portions of the second metal layer 14 on first dielectric layer 6 and on second dielectric layer 12, thereby leaving metal spacers 16 on the multi-layer structure 13. A spacer etch is a directional sputtering etch that removes second metal layer 14 so that metal spacers 16 remain on the sidewalls of multi-layer structure 13. The spacer etch uses the first and second dielectric layers as an etch stop.

If desired, second dielectric layer 12 can then be removed. Second dielectric layer 12 can be removed by any process that removes the second dielectric layer without removing first dielectric layer 6. If the first and second dielectric layers comprise different materials (e.g., when second dielectric layer 12 is silicon oxide and the first dielectric layer 6 is BPSG), any process that selectively etches the second dielectric layer 12 can be employed. The etch process would also remove the portions of metal spacers 16 laterally adjacent second dielectric layer 12, thus resulting in the metallization structure illustrated in FIG. 3*b*. When the first and second dielectric layers 6, 12 are similar or have similar etch rates (e.g., when both are silicon oxide or fluorine-doped), a facet etch process can be used. As shown in broken lines in FIG. 3*b*, when the first and second dielectric layers 6 and 12 exhibit similar etch rates, the thickness of first dielectric layer 6 will be reduced by substantially the thickness of removed second dielectric layer 12.

Figure 3B:
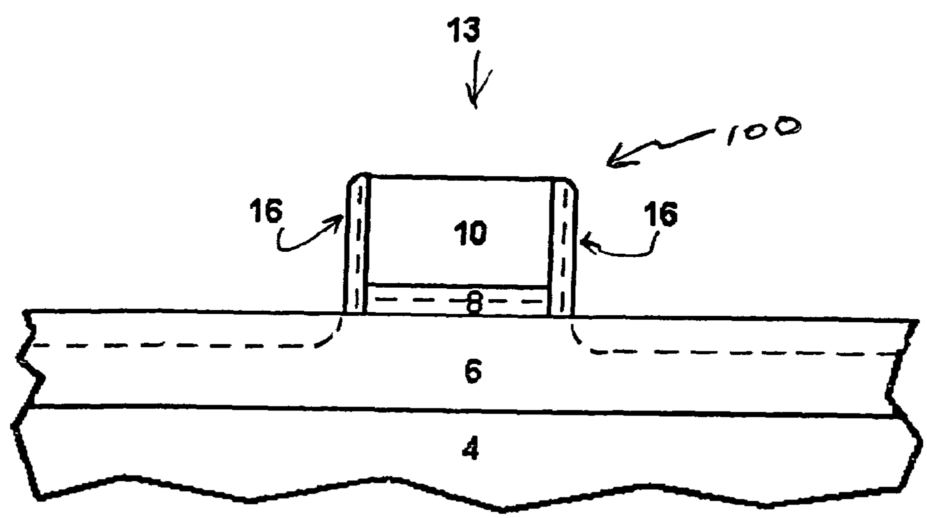

The metallization structures illustrated in FIGS. 3*a* and 3*b* reduce thermally induced stress voids in conductive lines 100. Metal layer 8 and metal spacers 16 serve as a protective coating at the respective lower and lateral surfaces of conductive lines 100 and at intersections thereof, thereby reducing the incidence of stress voids by preventing them from starting at these surfaces and intersections thereof on conductive line 100. Metal layer 8 and metal spacers 16 also increase reliability of conductive line 100 without reducing its resistance.

The metallization structures of FIGS. 3*a* and 3*b* can then be processed as desired to complete the IC device. For example, an interlevel dielectric layer could be deposited thereover, contact or via holes could be cut in the interlevel dielectric, a patterned metal layer could be formed to achieve a desired electrical interconnection pattern, and a protective dielectric overcoat deposited and patterned to expose desired bond pads.

Figure 4:
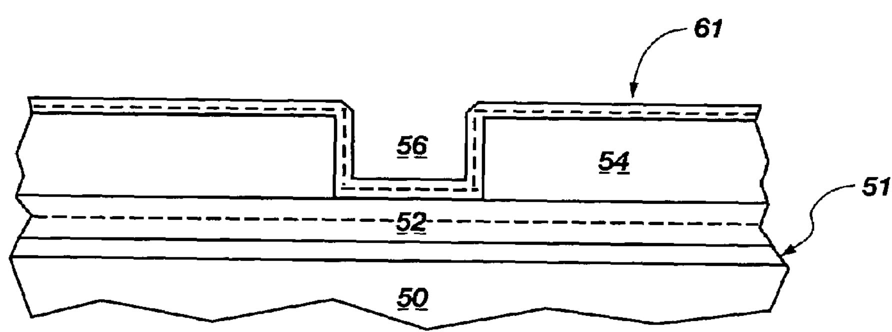
FIGS. 4, 5, 6, 7*a*, and 7*b* illustrate cross-sectional views of another process of forming a metallization structure, and the structure formed thereby, according to the invention.

Another embodiment of a process and resulting metallization structures of the present invention is represented in FIGS. 4 through 11. This embodiment may be characterized as more of an "additive" method or process than that described with respect to FIGS. 1 through 3*b*, in that metallization structures for interconnects are formed by deposition in apertures, such as vias or trenches. As such, it should be noted that cusping of material deposited to line the sidewall or sidewalls of an aperture may be of concern if the method of deposition is not sufficiently anisotropic or, in some instances, the aperture exhibits a very high aspect ratio. In FIG. 4, metal layer 52 has been deposited or otherwise formed over substrate 50. Any of the substrates employable as substrate 4 above can be used as substrate 50. Preferably, substrate 50 is a silicon wafer or bulk silicon region, such as an SOI or SOS structure. Such substrate 50 can have active and passive devices and other electrical circuitry fabricated on it, these circuit structures being interconnected by the metallization structures of the present invention. Therefore, a direct electrical path may exist between the devices and circuitry of the substrate 50 (or 4), the devices and circuitry being omitted herein for simplicity.

Metal layer 52 may comprise a discrete conductive member, such as a wire, a stud, or a contact. Preferably, metal layer 52 is substantially similar to metal layer 8 described above and may be of any of the same metals, alloys or compounds. If desired, a dielectric layer 51 can be formed on substrate 50 and beneath metal layer 52. Dielectric layer 51 is substantially similar to first dielectric layer 6 described above.

As illustrated in FIG. 4, dielectric layer 54 is then deposited or otherwise formed on metal layer 52. Dielectric layer 54 may be any dielectric or insulating material used in IC device fabrication, such as those listed above for sec ond dielectric layer 12. Preferably, dielectric layer 54 is silicon oxide or spin on glass (SOG). Dielectric layer 54 may be formed by any IC device fabrication process giving the desired physical and chemical characteristics.

An aperture 56 such as a via or trench is then formed in dielectric layer 54 by removing a portion of dielectric layer 54 to expose underlying metal layer 52. Aperture 56 may be formed by any IC device manufacturing method, such as a photolithographic patterning and etching process.

Figure 5:
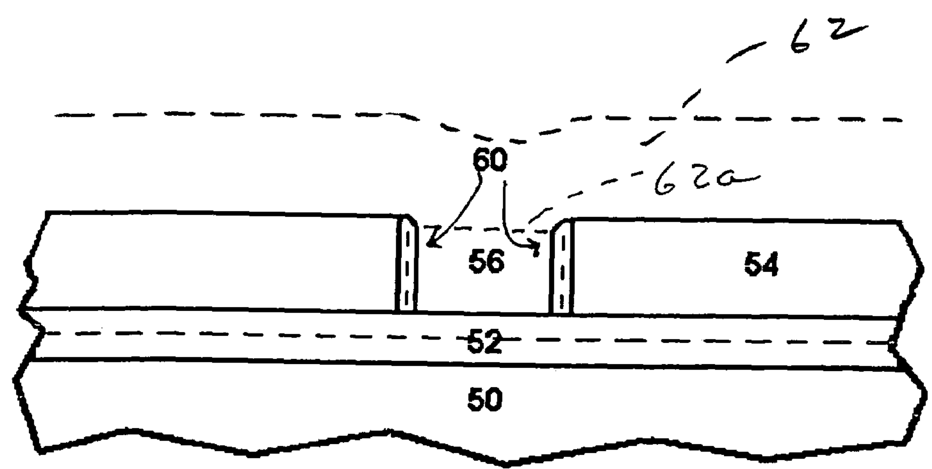

As shown in FIG. 5, metal collar 60 is formed on the sidewalls of aperture 56, using a spacer etch as known in the art. It will be understood that the term "collar" encompasses a co-parallel spacer structure 60 if aperture 56 is a trench extending over substrate 50. Similar to second metal layer 14, collar 60 may contain one or more metal layers with a single metal layer preferably used. Also in similar fashion to second metal layer 14, collar 60 may include not only metals, but their alloys and compounds. Like second metal layer 14, any metal can be employed in collar 60, provided it exhibits the desired characteristics, either alone or when combined with other metal layers, and the metals applicable to second metal layer 14 are equally applicable to collar 60. Preferably, collar 60 comprises the same metal as metal layer 52. More preferably, when metal layer 52 comprises Al, collar 60 comprises Ti.

Collar 60 is formed by an IC device fabrication process which does not degrade metal layer 52, yet forms a collar or spacer-like structure 60 on the sidewall or sidewalls of aperture 56. For example, layer 61 (shown in FIG. 4) of a material from which collar 60 is formed can be conformally deposited on dielectric layer 54 and the walls of aperture 56. Conformal coverage yields a substantially vertical sidewall in the dielectric aperture. While not preferred, a partially conformal layer of the material can be deposited instead. A highly conformal process is preferably employed to form layer 61. Portions of layer 61 on the bottom of aperture 56 and top of dielectric layer 54 are then removed, preferably by using an appropriate directional etch, such as reactive ion etching (RIE).

Figure 6:
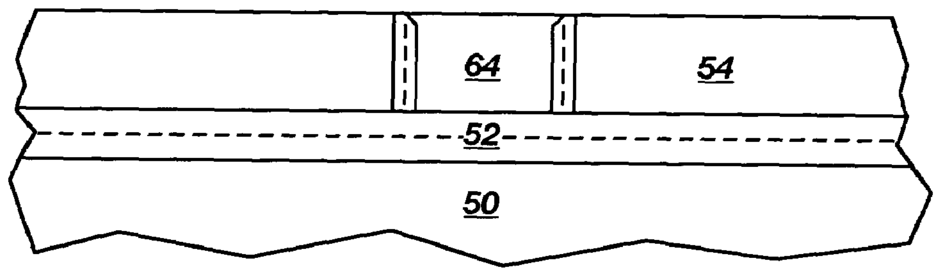

Conducting layer 62 is next deposited or otherwise formed to fill aperture 56 and extend over dielectric layer 54, as shown in broken lines in FIG. 5. Conducting layer 62 may be deposited by any IC device fabrication method yielding the desired characteristics. For example, conducting layer 62 may be deposited by a conformal or non-conformal deposition process. An abrasive planarization process, such as chemical-mechanical planarization (CMP), is then used to remove portions above the horizontal plane of the upper surface of dielectric layer 54 and leave conductive plug (in a via) or line (in a trench) 64 as illustrated in FIG. 6.

Similar to conducting layer 10, conducting layer 62 comprises any conducting material used in IC devices. Preferably, conducting layer 62 comprises aluminum, optionally containing other metals such as Si, W, Ti, and/or Cu. More preferably, conducting layer 62 is an aluminum-copper alloy. Conducting layer 62 may also comprise copper metal.

Figure 7A:
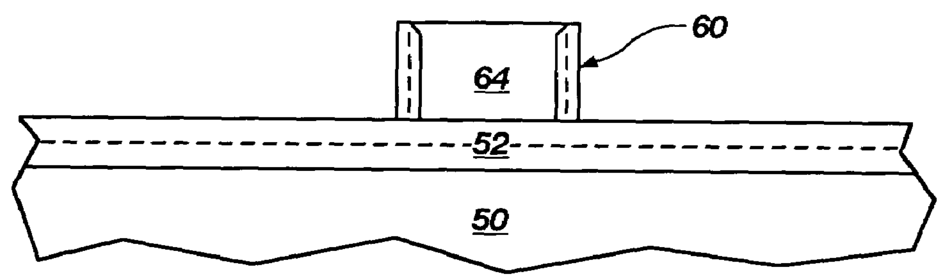
Figure 7B:
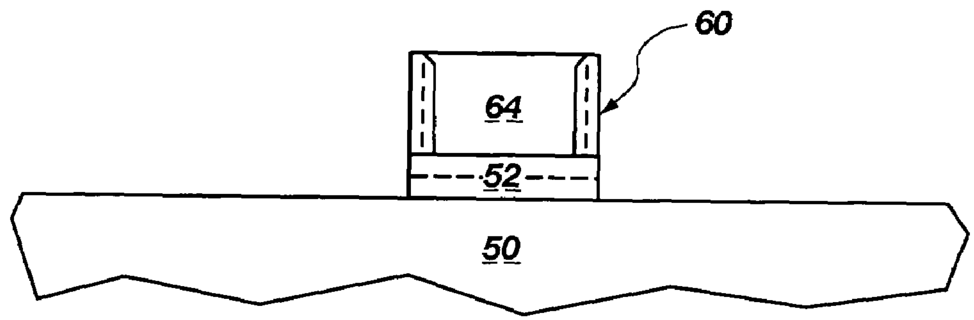

Dielectric layer 54 can then be optionally removed, thus forming the interconnect structure represented in FIG. 7*a*. Dielectric layer 54 can be removed by any process that does not degrade any of metal layer 52, conducting layer 62, or collar 60. For example, when dielectric layer 54 is silicon oxide, it may be removed by an HF wet etch solution or an oxide dry etch process. If desired, portions of metal layer 52 can then be removed, preferably by a directional etching process, to obtain the interconnect structure shown in FIG. 7*b*.

Figure 8:
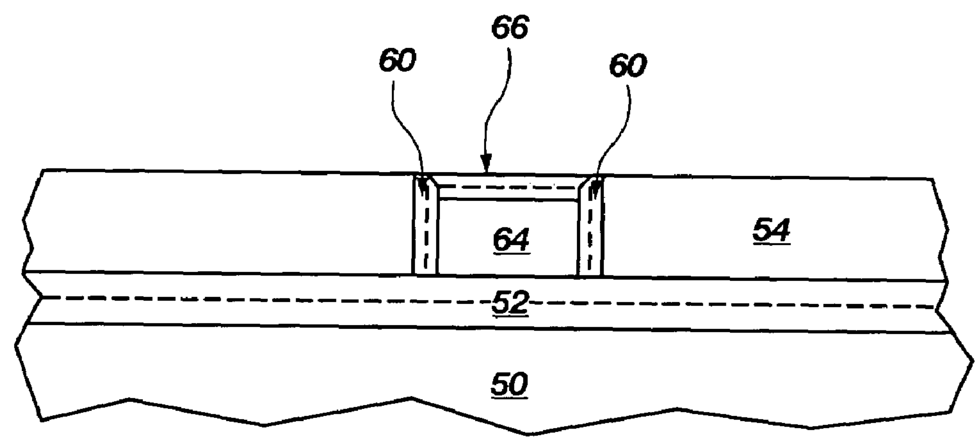
FIGS. 8 and 9 illustrate cross-sectional views of yet another process of forming a metallization structure, and the structure formed thereby, according to the invention.
Figure 9:
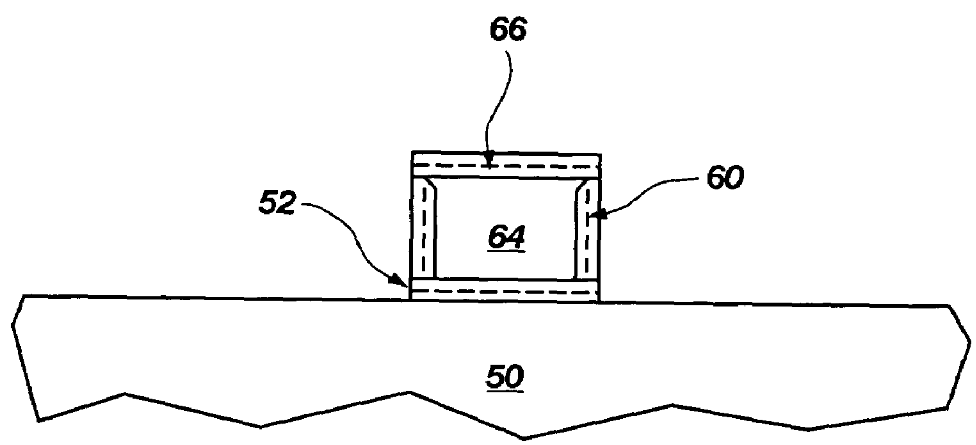
Figure 10:
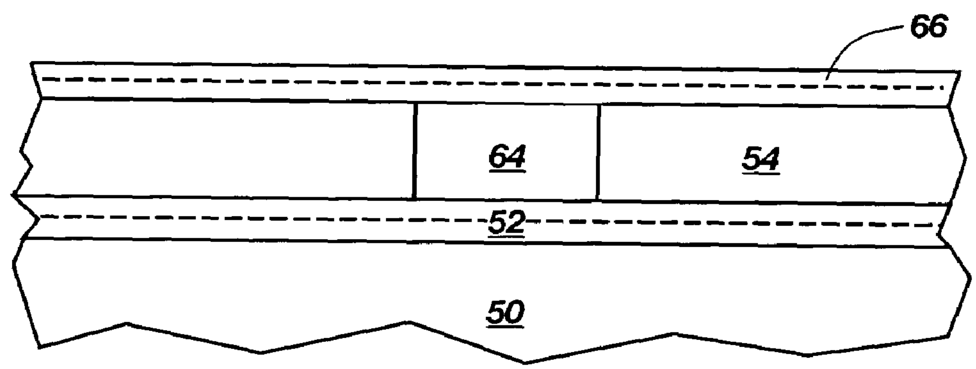
FIGS. 10 and 11 illustrate cross-sectional views of still another process of forming a metallization structure, and the structure formed thereby, according to the invention.
Figure 11:
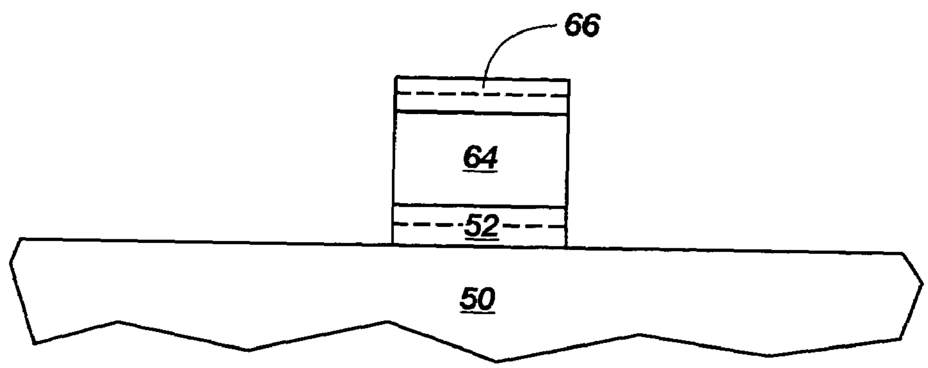
Figure 12:
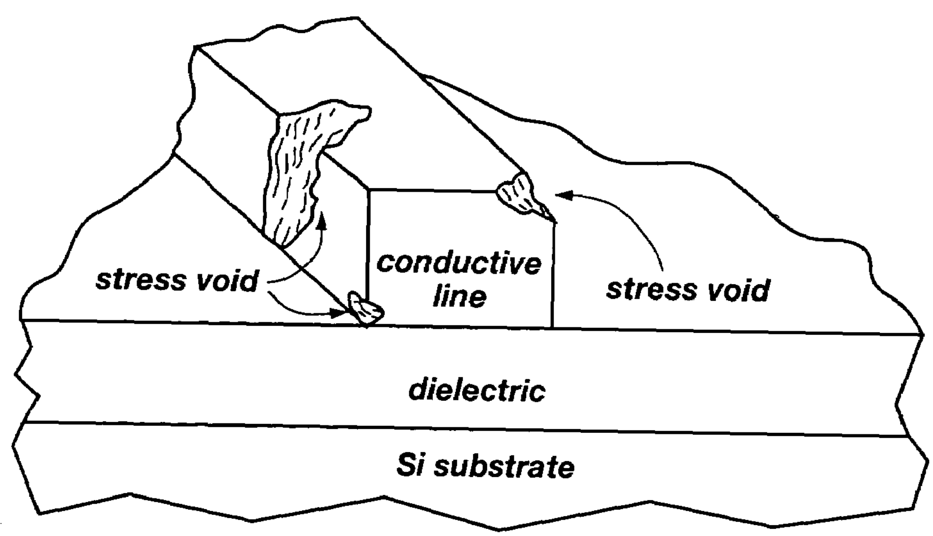
FIG. 12 illustrates a partial cross-sectional, perspective view of a conventional, prior art metallization structure exhibiting stress voids or notches.

In an alternative method, upper metal layer 66 can be formed over conductive plug or line 64 as depicted in FIG. 8. Like metal layer 52, upper metal layer 66 may contain one or more individual metal layers. Preferably, a single metal layer is used as upper metal layer 66. Similar to metal layer 52, upper metal layer 66 may contain not only metals, but their alloys and compounds. Preferably, upper metal layer 66 comprises the same material as collar 60. More preferably, when conductive plug 64 comprises Al, upper metal layer 66 comprises Ti.

Upper metal layer 66 can be formed over conductive plug 64 in the following manner. Conducting layer 62 is deposited in aperture 56 and over dielectric layer 54 as described above with respect to FIG. 5. Prior to completely filling aperture 56, however, the deposition of conducting layer 62 is halted as shown at 62*a* in FIG. 5, leaving an upper portion of aperture 56 empty (i.e., a recess is left at the top of aperture 56). Upper metal layer 66 is then deposited over conducting layer 62, including the still-empty upper portion of aperture 56. Portions of conducting layer 62 and upper metal layer 66 above the horizontal plane of dielectric layer 54 are then removed by a planarization process, such as CMP, to form a completely enveloped, or clad, interconnect structure. If desired, portions of dielectric layer 54 and metal layer 52 flanking the interconnect structure can be removed as described above to form the structure of FIG. 9.

In another process variant after forming metal layer 52 on substrate 50 and forming dielectric layer 54 with aperture 56 therethrough, but prior to forming collar 60, conductive plug or line 64 could be formed in aperture 56 as described above. Upper metal layer 66 could then be deposited, as described above, over conductive plug or line 64 and dielectric layer 54 to obtain the structure illustrated in FIG. 10. Portions of upper metal layer 66 not overlying conductive plug or line 64 could then be removed by a photolithographic pattern and etch process, followed by removing dielectric layer 54 by the method described above, to obtain the structure illustrated in FIG. 11. As explained above, the structure of FIG. 11 could then have a conformed metal layer deposited and etched (similar to the deposition and etch of second metal layer 14 above) to form a structure similar to that depicted in FIG. 3*a*.

While the preferred embodiments of the present invention have been described above, the invention defined by the appended claims is not to be limited by particular details set forth in the above description, as many apparent variations thereof are possible without departing from the spirit or scope thereof.

What is claimed is:

1. A metallization structure for a semiconductor device, comprising:

- a substrate comprising a substantially planar upper surface; and
- a conductive line for transmitting a signal laterally across the substrate, the conductive line consisting essentially of:
  - a metal layer defining a pattern on a portion of the substrate upper surface;
  - a single conducting layer overlying and substantially coextensive with the metal layer, the metal layer and the single conducting layer having substantially aligned sidewalls and the single conducting layer defining an upper surface of the conductive line, the single conducting layer selected from the group consisting of aluminum and copper; and
  - metal spacers flanking and extending at least substantially to a height of the sidewalls of the single conducting layer and metal layer.

2. The metallization structure of claim 1, further comprising a dielectric layer on the substrate upper surface and underlying the metal layer.

3. The metallization structure of claim 2, wherein the dielectric layer is silicon oxide or BPSG.

4. The metallization structure of claim 2, wherein the dielectric layer extends completely underneath the conductive line.

5. The metallization structure of claim 1, wherein the metal layer comprises Ti, Ta, W, Co or Mo or alloys or compounds thereof, including TaN or TiN.

6. The metallization structure of claim 1, wherein the metal layer is titanium or titanium nitride.

7. The metallization structure of claim 1, wherein the single conducting layer is an aluminum-copper alloy.

8. The metallization structure of claim 1, wherein the metal spacers comprise at least one layer of Ti, Ta, W, Co or Mo, or alloys thereof or compounds thereof, including TaN and TiN.

9. The metallization structure of claim 1, wherein the metal spacers are titanium or titanium nitride.

10. The metallization structure of claim 1, further comprising a dielectric layer on the single conducting layer and having sidewalls aligned with the sidewalls of the single conducting layer, the metal spacers extending along the sidewalls of the dielectric layer.

11. The metallization structure of claim 10, wherein the dielectric layer comprises a low dielectric constant material.

12. The metallization structure of claim 11, wherein the dielectric layer is fluorine-doped silicon oxide.

13. The metallization structure of claim 1, wherein the metal layer and the metal spacers comprise the same metal.

14. A metallization structure for a semiconductor device, composing:

- a substrate having a metal layer extending over the substrate, the metal layer at least underlying a conductive line, the conductive line for transmitting a signal across the substrate;
- a dielectric layer having an aperture therethrough defined by at least one sidewall and exposing the metal layer, the at least one sidewall of the aperture defining the conductive line;
- a metal spacer abutting at least one sidewall of the at least one sidewall of the aperture and in contact with the dielectric layer, the metal spacer in contact with the underlying metal layer; and
- a conductive layer of the conductive line in contact with the metal layer and the metal spacer, the metal spacer and the conductive layer substantially filling the aperture, the conductive layer having an upper surface substantially coincident with an upper surface of the dielectric layer.

15. The metallization structure of claim 14, wherein the metal layer comprises tantalum, titanium, tungsten, cobalt, molybdenum, or an alloy or a compound of any thereof, including TaN and TiN.

16. The metallization structure of claim 15, wherein the metal layer is titanium or titanium nitride.

17. The metallization structure of claim 14, wherein the metal spacer includes at least one layer of metal comprising tantalum, titanium, tungsten, cobalt, molybdenum, or alloys or compounds thereof, including TaN and TiN.

18. The metallization structure of claim 17, wherein the metal spacer is titanium or titanium nitride.

19. The metallization structure of claim 14, wherein the substrate comprises a dielectric layer underlying the metal layer.

20. The metallization structure of claim 19, wherein the dielectric layer underlying the metal layer is silicon oxide or BPSG.

21. The metallization structure of claim 14, wherein the metal layer and the metal spacer comprise the same metal.

22. The metallization structure of claim 14, wherein the metal layer is a first metal layer comprising Ti, Ta, W, Co or Mo or an alloy or a compound of any thereof, including TaN or TiN.

23. The metallization structure of claim 22, further including a second metal layer disposed between the first metal layer and the substrate and comprising TiN, TiW, WN, or TaN.

24. The metallization structure of claim 14, wherein the aperture contains conductive material.

25. A metallization structure for a semiconductor device, comprising:

a substrate having a metal layer extending over the substrate, the metal layer at least underlying a conductive line, the conductive line for transmitting a signal across the substrate;

a dielectric layer having an aperture therethrough defined by at least one sidewall and exposing the metal layer, the at least one sidewall of the aperture defining the conductive line;

a metal spacer abutting at least one sidewall of the at least one sidewall of the aperture and in contact with the dielectric layer, the metal spacer in contact with the underlying metal layer;

a conductive layer of the conductive line in contact with the metal layer and the metal spacer, the metal spacer and the conductive layer nearly filling the aperture; and at least one upper metal layer on the conductive layer comprising Ti, Ta, W, Co or Mo or an alloy or a compound of any thereof, including TaN or TiN, the at least one upper metal layer being disposed within the aperture laterally adjacent the metal spacer and having an upper surface substantially coincident with an upper surface of the dielectric layer and an uppermost extent of the metal spacer.

26. The metallization structure of claim 25, wherein the at least one upper metal layer comprises a plurality of upper metal layers.

27. The metallization structure of claim 25, wherein the at least one upper metal layer comprises titanium or titanium nitride.

28. A structure for transmitting a signal across a semiconductor device, the structure comprising:

a substrate comprising a substantially planar upper surface; and a conductive line extending over the upper surface and isolated therefrom by a dielectric layer at least underlying the conductive line, the conductive line consisting essentially of:

a metal layer above the dielectric layer, the metal layer defining a pattern on a portion of the substrate upper surface;

a single conducting layer overlying and substantially coextensive with the metal layer, the metal layer and the single conducting layer having substantially aligned sidewalls, wherein an upper surface of the single conductive layer defines an upper surface of the conductive line, the single conducting layer selected from the group consisting of aluminum and copper; and metal spacers flanking and extending at least substantially to a height of the sidewalls of the single conducting layer and metal layer.

29. The structure of claim 28, wherein the dielectric layer is silicon oxide or BPSG.

30. The structure of claim 28, wherein the metal layer comprises Ti, Ta, W, Co or Mo or alloys or compounds thereof, including TaN or TiN.

31. The structure of claim 28, wherein the metal layer is titanium or titanium nitride.

32. The structure of claim 28, wherein the single conducting layer is an aluminum-copper alloy.

33. The structure of claim 28, wherein the metal spacers comprise at least one layer of Ti, Ta, W, Co or Mo, or alloys thereof or compounds thereof, including TaN and TiN.

34. The structure of claim 28, wherein the metal spacers are titanium or titanium nitride.

35. The structure of claim 28, further comprising a dielectric layer on the single conducting layer and having sidewalls aligned with the sidewalls of the single conducting layer, the metal spacers extending along the sidewalls of the dielectric layer.

36. The structure of claim 35, wherein the dielectric layer comprises a low dielectric constant material.

37. The structure of claim 36, wherein the dielectric layer is fluorine-doped silicon oxide.

38. The structure of claim 28, wherein the metal layer and the metal spacers comprise the same metal.

39. A structure for transmitting a signal laterally across a substrate of a semiconductor device, the structure comprising:

a substrate having a metal layer of a conductive line disposed thereon;

a dielectric layer above the metal layer, the dielectric layer having an aperture therethrough defined by at least one sidewall and exposing the metal layer, the aperture at least extending a length of the conductive line;

a metal spacer flanking at least one sidewall of the at least one sidewall of the aperture and in contact with the dielectric layer, the metal spacer in contact with the underlying metal layer; and a conductive layer of the conductive line in contact with the metal layer and the metal spacer, the metal spacer and the conductive layer substantially filling the aperture, the conductive layer having an upper surface substantially coincident with an upper surface of the dielectric layer.

40. The structure of claim 39, wherein the metal layer comprises tantalum, titanium, tungsten, cobalt, molybdenum, or an alloy or a compound of any thereof, including TaN and TiN.

41. The structure of claim 40, wherein the metal layer is titanium or titanium nitride.

42. The structure of claim 39, wherein the metal spacer includes at least one layer of metal comprising tantalum, titanium, tungsten, cobalt, molybdenum, or alloys or compounds thereof, including TaN and TiN.

43. The structure of claim 42, wherein the metal spacer is titanium or titanium nitride.

44. The structure of claim 39, wherein the substrate comprises a dielectric layer underlying the metal layer.

45. The structure of claim 41, wherein the dielectric layer underlying the metal layer is silicon oxide or BPSG.

46. The structure of claim 39, wherein the metal layer and the metal spacer comprise the same metal.

47. The structure of claim 39, wherein the metal layer is a first metal layer comprising Ti, Ta, W, Co or Mo or an alloy or a compound of any thereof, including TaN or TiN.

48. The structure of claim 47, further including a second metal layer disposed between the first metal layer and the substrate and comprising TiN, TiW, WN, or TaN.

49. The structure of claim 39, wherein the metal spacer extends substantially a height of the at least one sidewall.

50. A structure for transmitting a signal laterally across a substrate of a semiconductor device, the structure comprising:

a substrate having a metal layer of a conductive line disposed thereon;

a dielectric layer above the metal layer, the dielectric layer having an aperture therethrough defined by at least one sidewall and exposing the metal layer, the aperture at least extending a length of the conductive line;

a metal spacer flanking at least one sidewall of the at least one sidewall of the aperture and in contact with the dielectric layer, the metal spacer in contact with the underlying metal layer;

a conductive layer of the conductive line in contact with the metal layer and the metal spacer, the metal spacer and the conductive layer nearly filling the aperture; and at least one upper metal layer on the conductive layer and comprising Ti, Ta, W, Co or Mo or an alloy or a compound of any thereof, including TaN or TiN, the at least one upper metal layer being disposed within the aperture laterally adjacent the metal spacer and having an upper surface substantially coincident with an upper surface of the dielectric layer and an uppermost extent of the metal spacer.

51. The structure of claim 50, wherein the at least one upper metal layer comprises a plurality of upper metal layers.

52. The structure of claim 50, wherein the at least one upper metal layer comprises titanium or titanium nitride.

* * * * *

UNITED STATES PATENT AND TRADEMARK OFFICE

CERTIFICATE OF CORRECTION

PATENT NO. : 7,071,557 B2
APPLICATION NO. : 09/388031
DATED : July 4, 2006
INVENTOR(S) : Salman Akram It is certified that error appears in the above-identified patent and that said Letters Patent is hereby corrected as shown below:

The title page showing the illustrative figure should be deleted to be replaced with the attached title page.

The drawing sheets, consisting of Figs. 3a, 3b and 5, should be deleted to be replaced with the drawing sheets, consisting of Figs. 3a, 3b and 5, as shown on the attached pages.

COLUMN 7, LINE 52, change "for sec ond" to --for second--

CLAIM 45,
COLUMN 12, LINE 47, change "The structure of claim 41," to --The structure of claim 44,--

Signed and Sealed this

Twenty-second Day of December, 2009

David J. Kappos
*Director of the United States Patent and Trademark Office*

(12) United States Patent
Akram

(10) Patent No.: US 7,071,557 B2
(45) **Date of Patent: *Jul. 4, 2006**

(54) METALLIZATION STRUCTURES FOR SEMICONDUCTOR DEVICE INTERCONNECTS, METHODS FOR MAKING SAME, AND SEMICONDUCTOR DEVICES INCLUDING SAME

(75) Inventor: Salman Akram, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154 (a)(2).

Subject to any disclaimer, the term of this patent is extended or adjusted under 35 U.S.C. 154(b) by 0 days.

(21) Appl. No.: 09/388,031

(22) Filed: Sep. 1, 1999

(65) Prior Publication Data

US 2002/0056914 A1 May 16, 2002

(51) Int. Cl.
*H01L 23/52* (2006.01)

(52) U.S. Cl. ..................... 257/751; 257/748; 257/773; 257/774; 257/762; 257/758

(58) Field of Classification Search ............... 257/301, 257/296, 669, 750, 752, 486, 751, 748, 741, 257/773, 774, 762, 758; 438/625, 627, 643, 438/653
See application file for complete search history.

(56) References Cited

U.S. PATENT DOCUMENTS 4,619,037 A * 10/1986 Taguchi et al. ............... 29/578
4,988,423 A 1/1991 Yamamoto et al.
5,275,973 A * 1/1994 Gelatos ...................... 216/18
5,300,813 A 4/1994 Joshi et al.
5,317,185 A 5/1994 Fernandes et al.
5,321,211 A * 6/1994 Haslam et al. ............. 174/262
5,335,138 A * 8/1994 Sandhu et al. ............. 257/306
5,356,659 A 10/1994 Seshubabu et al.
5,475,267 A 12/1995 Ishii et al.
5,489,548 A * 2/1996 Nishioka et al. ........... 438/396
5,498,889 A * 3/1996 Hayden ..................... 257/301

(Continued)

FOREIGN PATENT DOCUMENTS

EP 502647 A2 * 9/1992

(Continued)

OTHER PUBLICATIONS

Definition of "extent", Merriam-Webster online Dictionary, 10th edition, www.m-w.com.

*Primary Examiner*—Eugene Lee
(74) *Attorney, Agent, or Firm*—TraskBritt

(57) ABSTRACT

The present invention provides a metallization structure for semiconductor device interconnects such as a conductive line, and methods for making the same, wherein the metallization structure includes a substrate with a substantially planar upper surface, a foundation metal layer disposed on a portion of the substrate upper surface, a primary conducting metal layer overlying the foundation metal layer, and a metal spacer on the sidewalls of the primary conducting metal layer and the foundation metal layer. The present invention also provides a metallization structure and a method for making the same, wherein the metallization structure includes a substrate with a foundation metal layer disposed thereon, a dielectric layer with an aperture therethrough being disposed on the substrate, where the bottom of the aperture exposes the foundation metal layer of the substrate and a metal spacer on the sidewall of the aperture and a line or plug of a primary conducting metal filling the remaining portion of the aperture. These metallization structures are useful for reducing the incidence and severity of thermally induced stress voids.

52 Claims, 9 Drawing Sheets

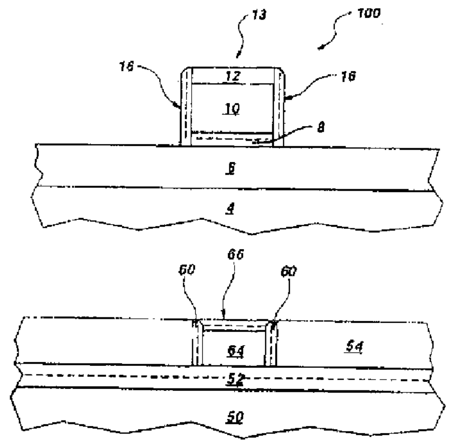

UNITED STATES PATENT AND TRADEMARK OFFICE

CERTIFICATE OF CORRECTION

PATENT NO. : 7,071,557 B2
APPLICATION NO. : 09/388031
DATED : July 4, 2006
INVENTOR(S) : Salman Akram It is certified that error appears in the above-identified patent and that said Letters Patent is hereby corrected as shown below:

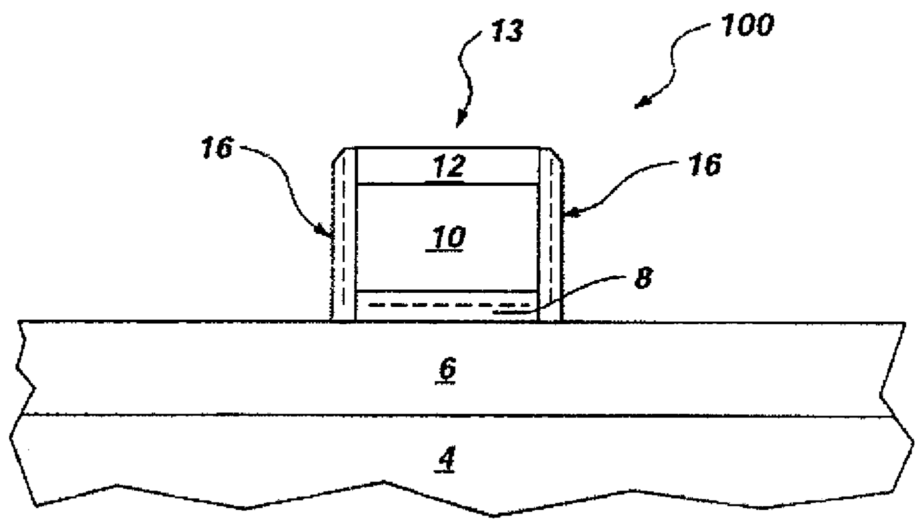

Fig. 3a

UNITED STATES PATENT AND TRADEMARK OFFICE

CERTIFICATE OF CORRECTION

PATENT NO. : 7,071,557 B2
APPLICATION NO. : 09/388031
DATED : July 4, 2006
INVENTOR(S) : Salman Akram It is certified that error appears in the above-identified patent and that said Letters Patent is hereby corrected as shown below:

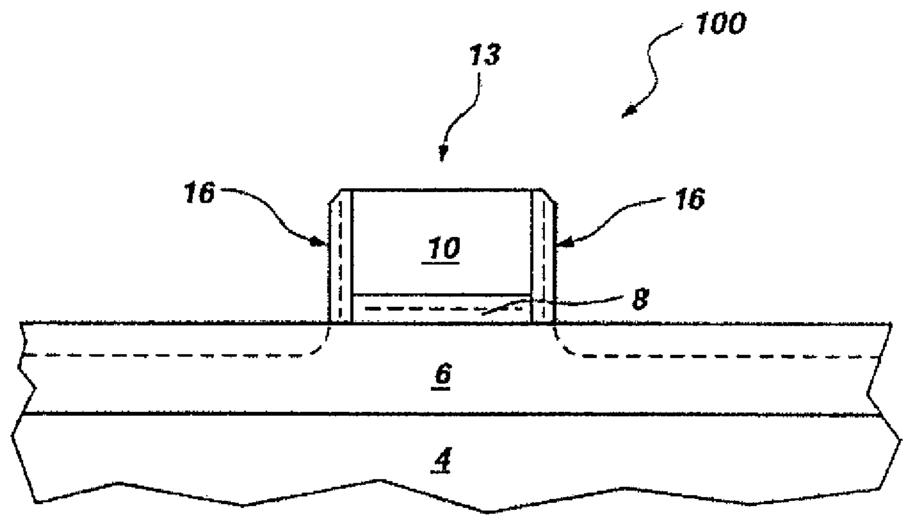

Fig. 3b

UNITED STATES PATENT AND TRADEMARK OFFICE

CERTIFICATE OF CORRECTION

PATENT NO. : 7,071,557 B2
APPLICATION NO. : 09/388031
DATED : July 4, 2006
INVENTOR(S) : Salman Akram It is certified that error appears in the above-identified patent and that said Letters Patent is hereby corrected as shown below:

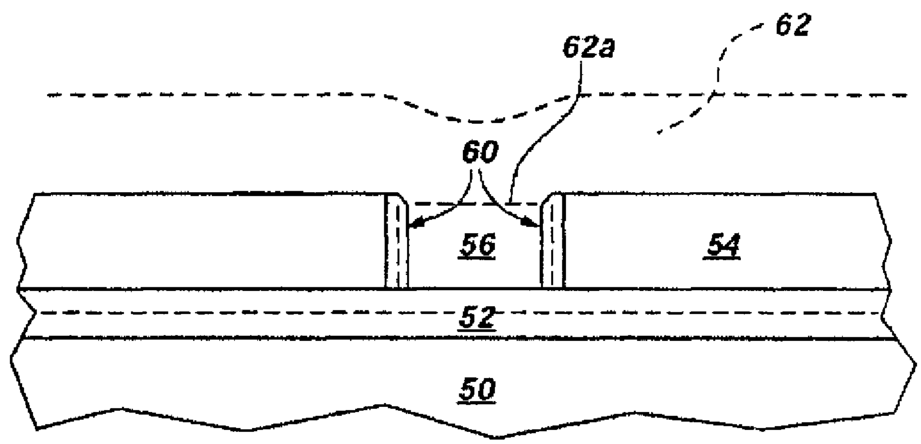

Fig. 5